(12) United States Patent
Masaki et al.

(10) Patent No.: US 9,063,277 B2
(45) Date of Patent: Jun. 23, 2015

(54) MIRROR, METHOD OF MANUFACTURING THE SAME, EXPOSURE APPARATUS, AND DEVICE MANUFACTURING METHOD

(75) Inventors: Fumitaro Masaki, Utsunomiya (JP); Akira Miyake, Nasukarasuyama (JP)

(73) Assignee: CANON KABUSHIKI KAISHA (JP)

( * ) Notice: Subject to any disclaimer, the term of this patent is extended or adjusted under 35 U.S.C. 154(b) by 552 days.

(21) Appl. No.: 13/332,582

(22) Filed: Dec. 21, 2011

(65) Prior Publication Data

US 2012/0170012 A1 Jul. 5, 2012

(30) Foreign Application Priority Data

Jan. 1, 2011 (JP) .................................. 2011-000004

(51) Int. Cl.
| | |
|---|---|
| *B05D 5/06* | (2006.01) |
| *F21V 9/04* | (2006.01) |
| *G03B 27/32* | (2006.01) |
| *G03B 27/54* | (2006.01) |
| *G02B 5/08* | (2006.01) |
| *G03F 7/20* | (2006.01) |
| *G21K 1/06* | (2006.01) |
| *B82Y 10/00* | (2011.01) |

(52) U.S. Cl.
CPC ............. *G02B 5/0816* (2013.01); *G03F 7/702* (2013.01); *G03F 7/70233* (2013.01); *G03F 7/70958* (2013.01); *G21K 1/062* (2013.01); *G21K 2201/064* (2013.01); *G21K 2201/067* (2013.01); *G03F 7/70316* (2013.01); *B82Y 10/00* (2013.01)

(58) Field of Classification Search
CPC ............. G02B 5/0816–5/0875; G02B 5/0891; G03F 7/702; G03F 7/70233; G03F 7/70316; G03F 7/70958

USPC ........... 355/67, 77; 378/34, 35; 359/359, 360, 359/584, 846; 427/162, 164–167
See application file for complete search history.

(56) References Cited

U.S. PATENT DOCUMENTS

| | | | |
|---|---|---|---|
| 6,396,900 B1 | 5/2002 | Barbee, Jr. | |
| 6,821,682 B1 * | 11/2004 | Stearns et al. | 430/5 |

(Continued)

FOREIGN PATENT DOCUMENTS

| | | |
|---|---|---|
| JP | 2005019628 A | 1/2005 |
| JP | 2006308483 A | 11/2006 |

(Continued)

OTHER PUBLICATIONS

JP Office Action issued Jan. 7, 2013 for corresponding JP2011-000004.

*Primary Examiner* — Colin Kreutzer
(74) *Attorney, Agent, or Firm* — Rossi, Kimms & McDowell LLP

(57) ABSTRACT

A method of manufacturing a mirror includes a first step of arranging, on a substrate, a shape adjusting layer having a layer thickness which changes by heat, a second step of arranging, on the shape adjusting layer, a reflection layer including a first layer, a second layer, and a barrier layer which is arranged between the first layer and the second layer, and prevents a diffusion of a material of the first layer and a material of the second layer, and a third step of bringing a shape of the reflection layer close to a target shape by changing a layer thickness profile of the shape adjusting layer after the second step, the third step including a process of partially annealing the shape adjusting layer.

13 Claims, 6 Drawing Sheets

(56) References Cited

U.S. PATENT DOCUMENTS

| | | | |
|---|---|---|---|
| 2001/0019803 A1* | 9/2001 | Mirkanimi | 430/5 |
| 2003/0164949 A1* | 9/2003 | Taylor et al. | 356/496 |
| 2006/0007433 A1* | 1/2006 | Ikuta et al. | 356/237.2 |
| 2008/0088916 A1* | 4/2008 | Benoit et al. | 359/359 |
| 2008/0259439 A1* | 10/2008 | Shiraishi | 359/360 |
| 2009/0130569 A1* | 5/2009 | Quesnel | 430/5 |
| 2010/0039632 A1 | 2/2010 | Van Herpen et al. | |
| 2012/0212721 A1* | 8/2012 | Clauss et al. | 355/67 |

FOREIGN PATENT DOCUMENTS

| | | |
|---|---|---|
| JP | 2007140147 A | 6/2007 |
| JP | 2007155407 A | 6/2007 |
| JP | 2007183120 A | 7/2007 |
| JP | 2007198782 A | 8/2007 |
| JP | 2010045355 A | 2/2010 |

* cited by examiner

MIRROR, METHOD OF MANUFACTURING THE SAME, EXPOSURE APPARATUS, AND DEVICE MANUFACTURING METHOD

BACKGROUND OF THE INVENTION

1. Field of the Invention

The present invention relates to a mirror, a method of manufacturing the same, an exposure apparatus, and a device manufacturing method.

2. Description of the Related Art

An exposure apparatus such as an EUV (Extreme Ultra Violet) exposure apparatus uses mirrors such as a multilayer mirror and a grazing-incidence total-reflection mirror. In the EUV range, the refractive index has a real part slightly smaller than one, so total reflection occurs upon grazing incidence in which EUV light strikes a reflection surface so as to graze it. Normally, upon grazing incidence in which light strikes a reflection surface at an angle below several degrees with respect to the reflection surface, a reflectance as high as several ten percent or more can be obtained, but the level of freedom of optical design is relatively low. Hence, a multilayer mirror formed by alternately stacking two substances having different optical constants (refractive indices) is useful as an EUV light mirror exhibiting a relatively high level of freedom of optical design. The use of a multilayer mirror makes it possible to obtain a desired reflectance even at an incident angle close to 90°, that is, upon approximately perpendicular incidence.

An EUV light multilayer mirror is formed by alternately stacking, for example, molybdenum and silicon on the surface of a glass substrate polished into an accurate surface shape. For example, the thickness of a molybdenum layer is 2 nm, the thickness of a silicon layer is 5 nm, and a composite film formed by these two layers is stacked by about 60 times. The sum of the thicknesses of layers formed by two substances will be referred to as a film period hereinafter. In the above-mentioned example, the film period is 2 nm+5 nm=7 nm.

When EUV light strikes a molybdenum/silicon multilayer mirror made of molybdenum and silicon, an EUV light component having a specific wavelength is reflected. Let $\theta$ be the incident angle, $\lambda$ be the wavelength of the EUV light, and d be the film period. Then, only an EUV light component which has a narrow bandwidth with $\lambda$ as its central wavelength so as to approximately satisfy the Bragg equation:

$$2 \times d \times \cos\theta = \lambda \quad (1)$$

can be efficiently reflected. The bandwidth at this time is about 0.6 to 1 nm. The maximum reflectance is about 70%. FIG. 4 shows the wavelength dependence of the reflectance when EUV light strikes a multilayer mirror having a film period of 7.2 nm at an incident angle of 15°.

The molybdenum and silicon which form the multilayer film may react with each other at their interface. Thus, the wavelength exhibiting a peak reflectance may change or the reflectance may decrease. Japanese Patent Laid-Open No. 2007-155407 discloses an approach in which $B_4C$ or $SiO_2$ is arranged between the molybdenum and the silicon as an intermediate layer.

The allowable shape error $\sigma$ (rms value) is given by the Marechal equation:

$$\sigma = \lambda/(28 \times \sqrt{n}) \quad (2)$$

where n is the number of mirrors which constitute a projection optical system, and $\lambda$ is the wavelength of the EUV light. Assuming, for example, six mirrors, the allowable shape error $\sigma$ is 0.2 nm when the wavelength is 13.5 nm. The shape error can include a substrate shape error and film shape mirror. It is difficult to adjust the substrate shape and the film shape so that both of their errors fall below the allowable error. Japanese Patent Laid-Open No. 2005-19628 proposes a technique of correcting the shape of a mirror by thermal expansion using a heater attached to the mirror.

The technique described in Japanese Patent Laid-Open No. 2005-19628 requires constant control of the mirror temperature, which makes a temperature control mechanism indispensable, thus complicating the structure of a mirror unit.

SUMMARY OF THE INVENTION

The present invention provides a technique advantageous in obtaining a mirror having excellent shape accuracy despite its simple configuration.

One of the aspect of the present invention provides a method of manufacturing a mirror, comprising a first step of arranging, on a substrate, a shape adjusting layer having a layer thickness which changes by heat, a second step of arranging, on the shape adjusting layer, a reflection layer including a first layer, a second layer, and a barrier layer which is arranged between the first layer and the second layer, and prevents a diffusion of a material of the first layer and a material of the second layer, and a third step of bringing a shape of the reflection layer close to a target shape by changing a layer thickness profile of the shape adjusting layer after the second step, the third step including a process of partially annealing the shape adjusting layer.

Further features of the present invention will become apparent from the following description of exemplary embodiments with reference to the attached drawings.

DESCRIPTION OF THE EMBODIMENTS

Figure 2:
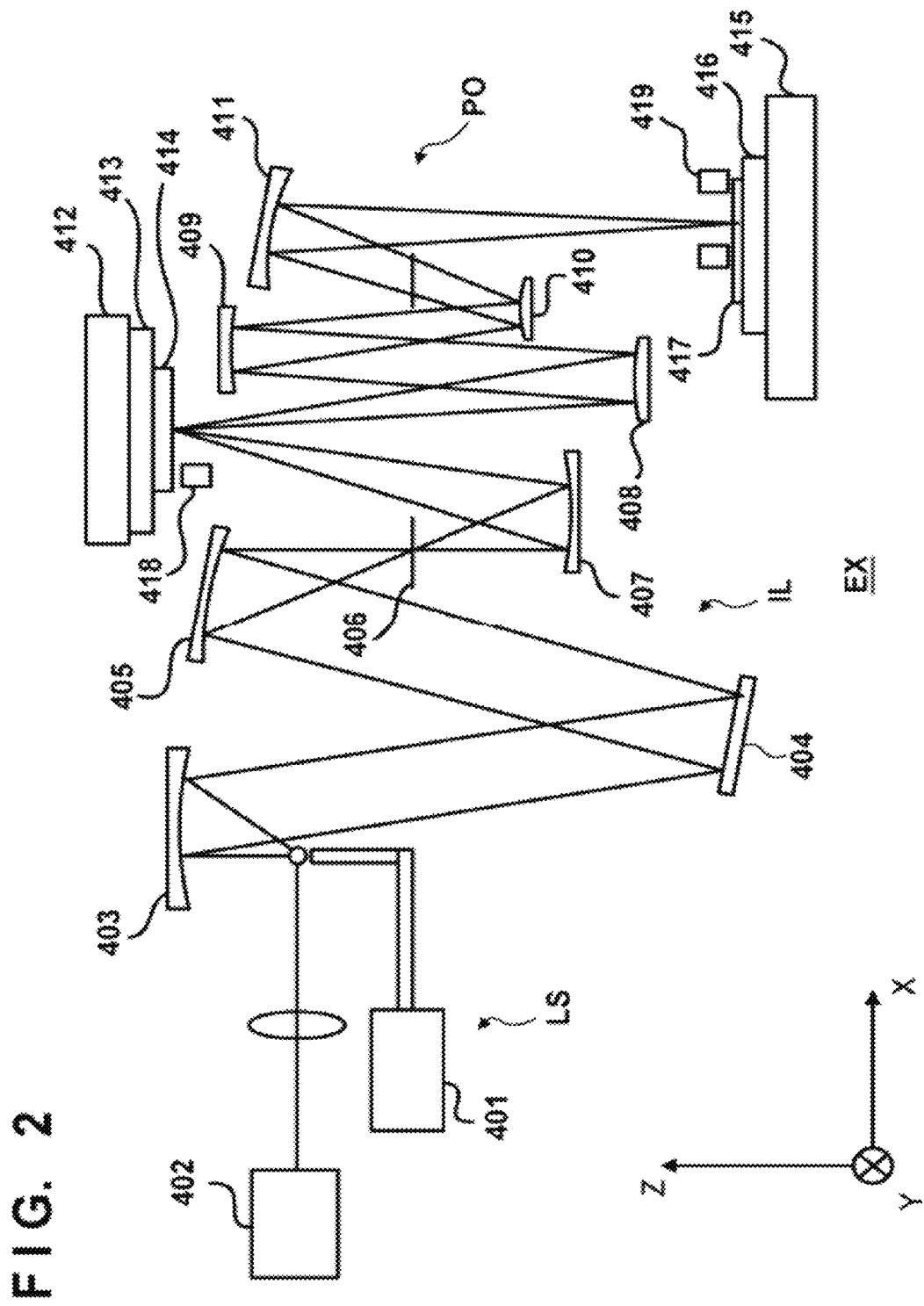
FIG. 2 is a view showing the schematic arrangement of an EUV exposure apparatus according to an embodiment of the present invention.

Embodiments of the present invention will be described below with reference to the accompanying drawings. The configuration of an exposure apparatus EX according to an embodiment of the present invention will be described first with reference to FIG. 2. To give a detailed example, the exposure apparatus EX is applied to an EUV exposure apparatus herein. However, the exposure apparatus according to the present invention is not limited to an EUV exposure apparatus, and is applicable to all exposure apparatuses having optical systems including mirrors. Also, the mirror according to the present invention is not limited to a mirror serving as a component of an exposure apparatus such as an EUV exposure apparatus, and can be used as components of all other apparatuses.

The exposure apparatus EX includes a light source LS, illumination optical system IL, projection optical system PO, original stage mechanism 412, and substrate stage mechanism 415. In this embodiment, the light source LS serves as an EUV light source. The light source LS, for example, irradiates a target material supplied from a target supplying apparatus 401 into a vacuum chamber with laser light from a pulsed laser light source 402. This produces a high-temperature plasma, and EUV light (having a wavelength of, for example, 13.5 nm) emitted by the plasma is extracted. A metal thin film, an inert gas, or a liquid droplet, for example, can be used as the target material, and supplied into the vacuum chamber by a method such as gas jetting. To improve the average intensity of the generated EUV light, the pulsed laser light source 402 preferably has as high a repetition frequency as possible, and is therefore normally operated at a repetition frequency of several kilohertz.

The illumination optical system IL can include a plurality of multilayer mirrors 403, 405, and 407 and an optical integrator 404. The first multilayer mirror 403 focuses EUV light almost isotropically radiated from the plasma. The optical integrator 404 uniformly illuminates an original 414 at a predetermined numerical aperture. An aperture 406 for defining the illuminated region on the original 414 to an arcuated shape can be provided at a position conjugate to that of the original 414. The projection optical system PO can include a plurality of multilayer mirrors 408, 409, 410, and 411. The smaller the number of mirrors, the higher the use efficiency of the EUV light, but the higher the level of difficulty of aberration correction becomes at the same time. Although the projection optical system PO is formed by four mirrors in an example shown in FIG. 2, it may be formed by, for example, six or eight mirrors. The reflection surface of each mirror has a concave or convex, spherical or aspherical shape. The projection optical system PO has a numerical aperture NA of about 0.2 to 0.3.

The original stage mechanism 412 and the substrate stage mechanism 415 scan the original 414 and a substrate 417, respectively, at a speed ratio proportional to the reduction magnification. Note that the scanning direction within a plane along the surface of the original 414 or substrate 417 is defined as the X-axis direction, a direction perpendicular to the scanning direction is defined as the Y-axis direction, and a direction perpendicular to the surfaces of the original 414 and substrate 417 is defined as the Z-axis direction. The original 414 is held by an original chuck 413 mounted on the original stage mechanism 412. The original stage mechanism 412 includes a mechanism which moves the original 414 at high speed in the X-axis direction. The original stage mechanism 412 also includes a positioning mechanism which finely moves the original 414 in the X-, Y-, and Z-axis directions and rotation directions about the respective axes. The position and orientation of the original 414 are measured by a laser interferometer 418 and controlled based on the measurement result.

The substrate 417 is held by a substrate chuck 416 mounted on the substrate stage mechanism 415. The substrate stage mechanism 415 includes a mechanism which moves the substrate 417 at high speed in the X-axis direction, like the original stage mechanism 412. The substrate stage mechanism 415 also includes a positioning mechanism which finely moves the substrate 417 in the X-, Y-, and Z-axis directions and rotation directions about the respective axes. The position and orientation of the substrate 417 are measured by a laser interferometer 419 and controlled based on the measurement result. After scanning exposure of one shot region on the substrate 417 is completed, the substrate stage mechanism 415 moves the substrate 417 step by step in the X- and/or Y-axis directions, and performs scanning exposure of the next shot region. In this way, all shot regions on the substrate 417 undergo scanning exposure.

Figure 1:
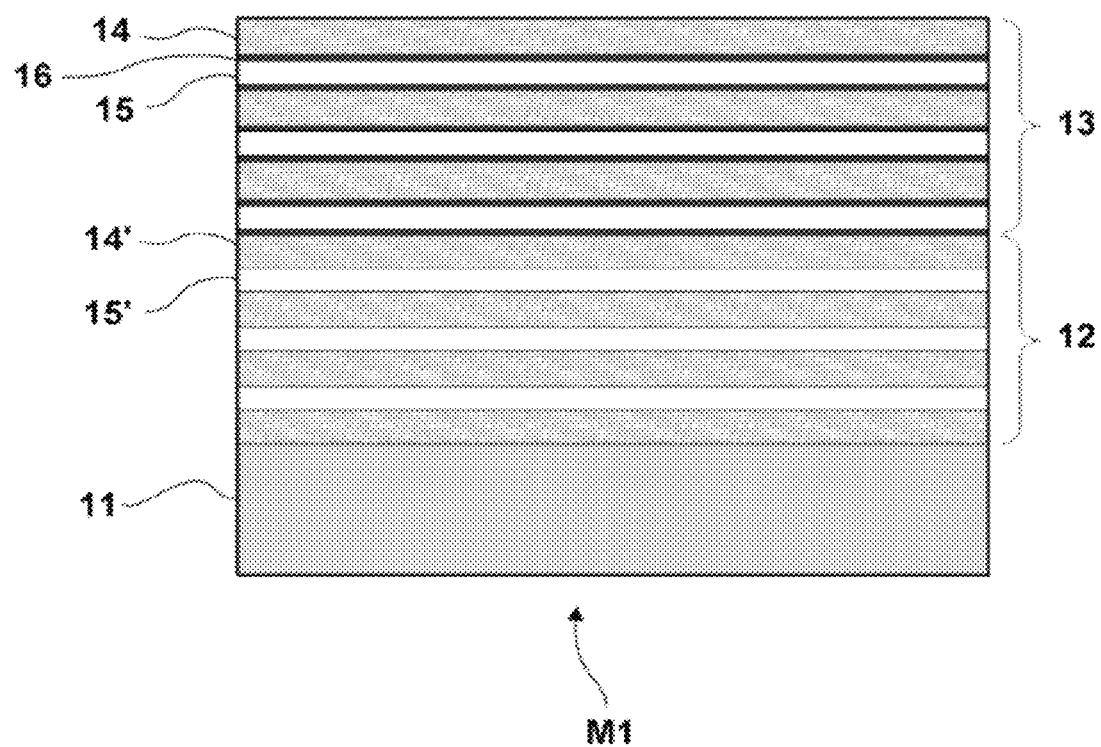
FIG. 1 is a sectional view schematically showing the configuration of a mirror according to an embodiment of the present invention.

The configuration of a mirror M1 according to the first embodiment of the present invention will be described next with reference to FIG. 1. Although the mirror M1 shown in FIG. 1 is useful as a component of an optical system such as the illumination optical system IL and/or projection optical system PO of the exposure apparatus EX mentioned above, it can also be used as components of other exposure apparatuses or apparatuses other than exposure apparatuses. The mirror M1 includes a substrate (base material) 11, a shape adjusting layer 12 arranged on the substrate 11, and a reflection layer 13 arranged on the shape adjusting layer 12.

The substrate 11 can be formed by, for example, a glass material such as low expansion coefficient glass, or a material which has a low thermal expansion coefficient and high rigidity and high hardness, such as silicon carbide. The shape adjusting layer 12 is formed so that its layer thickness changes by heat. The shape adjusting layer 12 includes first material layers 15' and second material layers 14', and its layer thickness profile changes as a first material and a second material react with each other by heat partially applied to the shape adjusting layer 12. The first material which forms the first material layers 15' can, for example, be one material selected from the group consisting of Be, B, C, Si, P, S, K, Ca, Sc, Br, Rb, Sr, Y, Zr, Nb, Mo, Ba, La, Ce, Pr, Pa, and U. The second material which forms the second material layers 14' can be one material which is selected from this group and different from the first material.

The reflection layer 13 includes first layers 15, second layers 14, and barrier layers 16 each of which is arranged between the first layer 15 and the second layer 14 and prevents the reaction (diffusion) of a material which forms the first layers 15 and that which forms the second layers 14. Note that the material which forms the first material layers 15' and that which forms the first layers 15 can be the same, and the material which forms the second material layers 14' and that which forms the second layers 14 can be the same. In this case, it is easy to continuously form the shape adjusting layer 12 and the reflection layer 13 on the substrate 11 in a chamber of one deposition apparatus. The material which forms the first material layers 15' and that which forms the first layers 15 are typically molybdenum (Mo), and the material which forms the second material layers 14' and that which forms the second layers 14 are typically silicon (Si). The barrier layers 16 can be, for example, $B_4C$ layers or $SiO_2$ layers.

Figure 3:
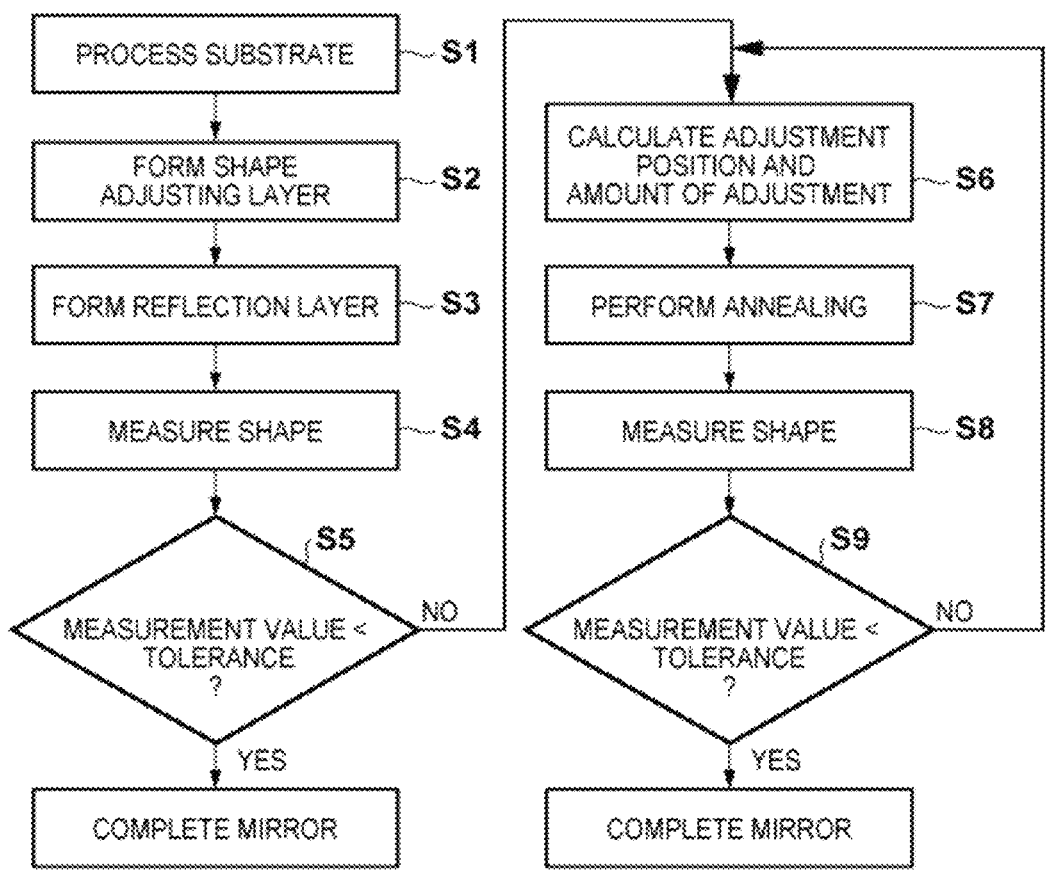
FIG. 3 is a flowchart showing a method of manufacturing a mirror according to an embodiment of the present invention.
Figure 4:
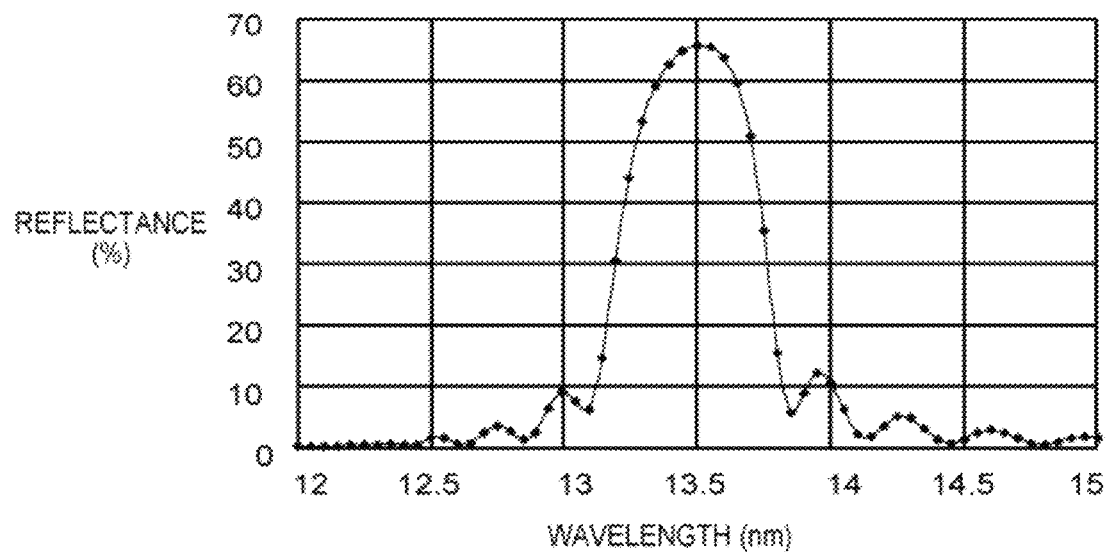
FIG. 4 is a graph showing the reflectance characteristics of a molybdenum/silicon multilayer mirror.

An exemplary method of manufacturing a mirror M1 will be described with reference to FIG. 3. First, in step S1, a material substrate formed by, for example, a glass material such as low expansion coefficient glass, or a material which has a low thermal expansion coefficient and high rigidity and high hardness, such as silicon carbide, is prepared, and its reflection surface is processed by, for example, polishing to obtain a substrate 11.

In step S2 (first step), a shape adjusting layer 12 is formed on the substrate 11. The shape adjusting layer 12 can be formed by alternately stacking, for example, molybdenum layers serving as first material layers 15' and silicon layers serving as second material layers 14'. In this case, letting M1 [nm] be the thickness of each molybdenum layer serving as the first material layer 15', and S1 [nm] be the thickness of each silicon layer serving as the second material layer 14', M1≈2 nm and S1≈5 nm can be set. A composite film formed by the first material layer 15' and second material layer 14' can be stacked by, for example, about 40 times. The thickness of the shape adjusting layer 12 is determined by the upper limit of the target amount of adjustment. By setting M1=2 nm and S1=5 nm, and stacking a composite film formed by the first material layer 15' and second material layer 14' by about 40 times, the shape of the mirror M1 can be adjusted by up to about 0.7 nm. To increase the upper limit of the target amount of adjustment, the number of layers to be stacked need only be increased.

Figure 6:
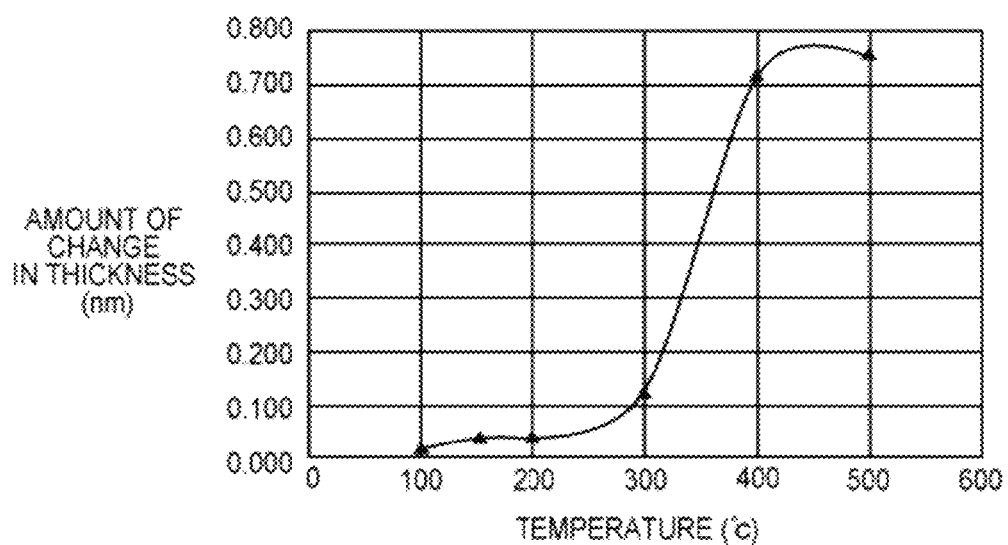
FIG. 6 is a graph illustrating the temperature dependence of the maximum amount of change in thickness of a shape adjusting layer.

FIG. 6 illustrates the temperature dependence for the maximum amount of change in thickness of the shape adjusting layer 12 when the shape adjusting layer 12 formed by stacking a composite film of the first material layer 15' and second material layer 14' (thicknesses: M1=2 nm and S1=5 nm) by about 40 times is annealed. Upon annealing, the material that forms the first material layers 15' and that which forms the second material layers 14' react with each other, thus decreasing the thickness of the shape adjusting layer 12. The thickness of the shape adjusting layer 12 can be partially changed (decreased) by partially annealing the shape adjusting layer 12 by, for example, laser light irradiation. In other words, the thickness profile of the shape adjusting layer 12 can be adjusted by partially annealing the shape adjusting layer 12 by, for example, laser light irradiation. The maximum amount of change (maximum amount of decrease) in thickness of the shape adjusting layer 12 upon annealing increases with a rise in annealing temperature when the annealing temperature is 440° C. or less. The amount of change (amount of decrease) in thickness of the shape adjusting layer 12 upon annealing increases with prolongation of the annealing time, but typically is saturated after a specific time (for example, 60 min).

In step S3 (second step), a reflection layer 13 is formed on the shape adjusting layer 12. Thus, a mirror M1 having an unadjusted shape is formed. The reflection layer 13 can be formed by stacking, for example, molybdenum layers serving as first layers 15, silicon layers serving as second layers 14, and $B_4C$ layers or $SiO_2$ layers each of which serves as a barrier layer 16 and is arranged between the first layers 15 and the second layers 14. At this time, one of the barrier layers 16 can come into contact with the top layer of the shape adjusting layer 12. Letting M2 [nm] be the thickness of each molybdenum layer serving as the first layer 15, S2 [nm] be the thickness of each silicon layer serving as the second layer 14, and B2 [nm] be the thickness of each $B_4C$ layer serving as the barrier layer 16, M2≈2 nm, S2≈4 nm, and B2≈0.5 nm can be set. A composite film of the first layer 15, second layer 14, and barrier layer 16 can be stacked by about 60 times.

In general, as long as a molybdenum/silicon multilayer mirror used in the EUV range is manufactured, the amount of EUV light reflected at a position below the reflection layer 13 becomes small enough to be negligible upon stacking a composite film by about 60 times. In this manner, the number of times of stacking a composite film which forms the reflection layer 13 can be set so that even if the shape adjusting layer 12 under the reflection layer 13 changes, this change does not influence the reflectance of the reflection layer 13.

In steps 4 to 9 (third step) subsequent to step S3, the thickness profile of the shape adjusting layer 12 is changed to bring the shape of the reflection layer 13 close to a target shape. A series of processes in these steps includes a process of partially annealing the shape adjusting layer 12. More specifically, in step S4, the shape of the reflection layer 13 of the mirror M1 is measured. In this measurement, the shape of the top surface of the reflection layer 13 or the thickness profile of the reflection layer 13, for example, can be measured using light interference. In step S5, it is evaluated whether the measurement value measured in step S4 falls within the tolerance of a target value indicating the target shape. If the measurement value falls within the tolerance, it is determined that the mirror M1 is completed; otherwise, steps 6 to 9 are executed. Note that the tolerance can fall within the range of, for example, ±0.2 nm with respect to the target value indicating the target shape.

Figure 8:
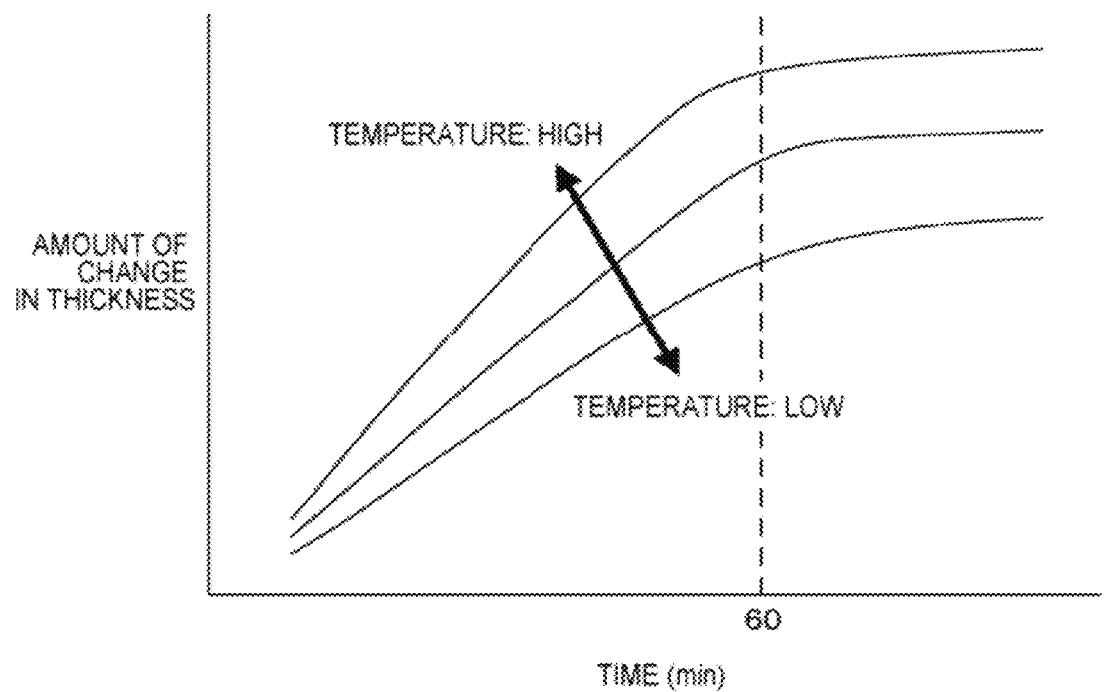
FIG. 8 is a graph showing the temperature and time dependence of the amount of change in thickness of a shape adjusting layer.

In step S6, to bring the shape of the reflection layer 13 close to the target shape, the position (adjustment position) at which the shape adjusting layer 12 is to be adjusted, and the amount (amount of adjustment) of the shape adjusting layer 12 to be adjusted are calculated. FIG. 8 is a graph showing the temperature and time dependence of the amount of change in thickness of the shape adjusting layer 12. As the annealing temperature rises, the amount of change (amount of decrease) in thickness of the shape adjusting layer 12 increases, as shown in FIG. 8. However, when the annealing temperature exceeds a specific temperature, the amount of change in thickness of the shape adjusting layer 12 upon annealing is saturated and remains the same despite a rise in annealing temperature. Also, as the annealing time prolongs, the amount of change in thickness of the shape adjusting layer 12 upon annealing increases. However, the amount of change in thickness of the shape adjusting layer 12 is saturated after a specific time. The amount of adjustment of the shape adjusting layer 12 can be determined based on the temperature and time dependence of the shape adjusting layer 12, as illustrated in FIG. 8. The temperature and time dependence of the shape adjusting layer 12 can be given by a specific table or function. Note that when the amount of change (amount of decrease) in thickness of the shape adjusting layer 12 upon one annealing operation is set sufficiently smaller than the target amount of adjustment, neither a precise table nor function of the temperature and time dependence of the shape adjusting layer 12 is necessary. The adjustment position of the shape adjusting layer 12 is determined as a position at which the measurement value measured in step S4 or S8 does not fall within the tolerance.

In step S7, the mirror M1 is irradiated with laser light at the adjustment position in accordance with the amount of adjustment, based on the adjustment position and the amount of adjustment determined in step S6. Upon laser light irradiation, heat is applied to the shape adjusting layer 12 at the adjustment position, so its thickness at the adjustment position changes. The change in thickness of the shape adjusting layer 12 is irreversible, so the changed thickness does not return to the original thickness even after the stop of laser light irradiation.

Note that due to the presence of the barrier layers 16, the thickness of the reflection layer 13 is less likely to change as the material which forms the first layers 15 and that which forms the second layers 14 react with each other. However, the thickness of the reflection layer 13 may change upon annealing, depending on the thickness or temperature of the barrier layer 16. U.S. Pat. No. 6,396,900 asserts that the thickness of each $B_4C$ layer between the molybdenum and the silicon must be set to 0.3 nm or more to maintain a given thermal stability at a temperature of 300° C. or more. On the other hand, Japanese Patent Laid-Open No. 2006-308483 reports that with an increase in thickness of each $B_4C$ layer, the molybdenum layers become thinner and therefore become less likely to crystallize, resulting in a decrease in its reflectance. When the thickness of each $B_4C$ layer serving as a barrier layer is set to 0.3 nm or less so as to avoid a decrease in reflectance of the molybdenum layers, it is especially preferable to take into consideration a change in thickness of the reflection layer 13. Hence, to calculate the amount of adjustment in step S6, the sum of the amount of adjustment of the shape adjusting layer 12 and that of the reflection layer 13 is preferably determined. This makes it possible to partially anneal the shape adjusting layer 12 so that the shape of the reflection layer 13 comes close to the target shape upon changes in thickness of both the shape adjusting layer 12 and reflection layer 13.

In step S8, as in step S4, the shape of the reflection layer 13 of the mirror M1 is measured. In step 9, it is evaluated whether the measurement value measured in step S8 falls within the tolerance of the target value indicating the target shape. If the measurement value falls within the tolerance, it is determined that the mirror M1 is completed; otherwise, steps 6 to 9 are executed again.

Figure 5:
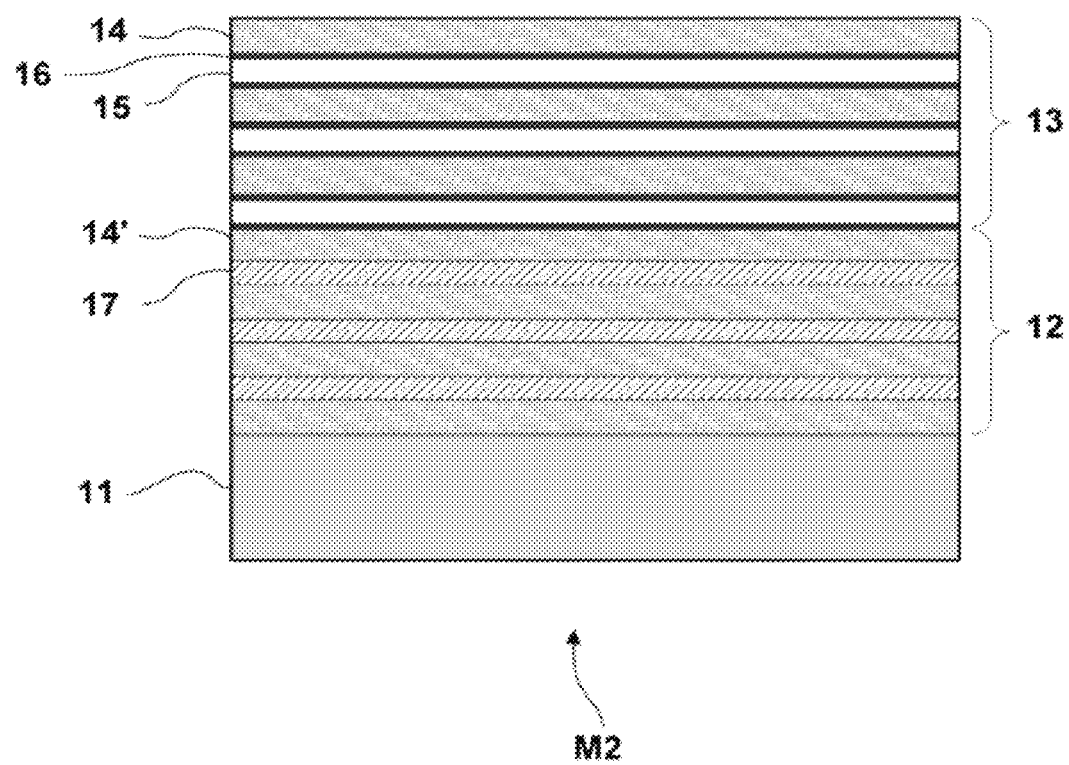
FIG. 5 is a sectional view schematically showing the configuration of a mirror according to another embodiment of the present invention.

The configuration of a mirror M2 according to the second embodiment of the present invention will be described with reference to FIG. 5. The mirror M2 according to the second embodiment can be used in place of the mirror M1 according to the first embodiment. Details which are not particularly referred to herein, such as the configuration of an exposure apparatus EX and a method of manufacturing a mirror M2, can be the same as in the first embodiment. The second embodiment can be construed as an embodiment which defines a specific combination of materials listed in the first embodiment. A shape adjusting layer 12 includes first material layers 17 and second material layers 14', and the thickness profile of the shape adjusting layer 12 changes as a first material and a second material react with each other by heat partially applied to the shape adjusting layer 12. In the second embodiment, the material which forms the first material layers 17 is carbon (C), and that which forms the second material layers 14' is silicon (Si). Upon annealing the shape adjusting layer 12, the silicon and the carbon react with each other at the interface between the silicon and carbon layers to form silicon carbide, so the thickness of the shape adjusting layer 12 changes.

Figure 7:
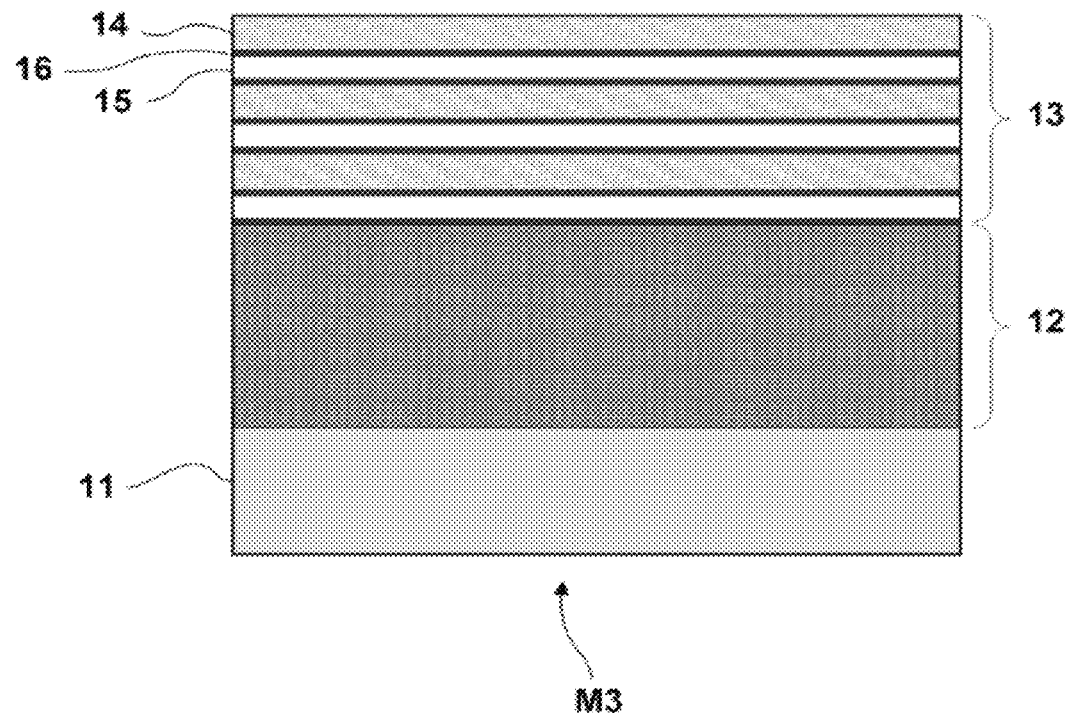
FIG. 7 is a sectional view schematically showing the configuration of a mirror according to still another embodiment of the present invention.

The configuration of a mirror M3 according to the third embodiment of the present invention will be described with reference to FIG. 7. The mirror M3 according to the third embodiment can be used in place of the mirror M1 according to the first embodiment. Details which are not particularly referred to herein, such as the configuration of an exposure apparatus EX and a method of manufacturing a mirror M3, can be the same as in the first embodiment. A shape adjusting layer 12 may be formed by a multilayer film, as in the first or second embodiment, but may be formed by a monolayer film. In the third embodiment, the shape adjusting layer 12 is formed by a monolayer, that is, only an amorphous silicon layer. Amorphous silicon crystallizes and changes in density at a temperature of about 1,000 K. The thickness of the shape adjusting layer 12 can be changed by exploiting this change in density.

A device manufacturing method according to a preferred embodiment of the present invention is suitable for manufacturing a device such as a semiconductor device or a liquid crystal device. This method can include a step of exposing a substrate coated with a photosensitive agent to light using the above-mentioned exposure apparatus EX, and a step of developing the exposed substrate. This method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-000004, filed Jan. 1, 2011, which is hereby incorporated by reference herein in its entirety.

What is claimed is:

1. A method of manufacturing a mirror, comprising:
a first step of arranging, on a substrate, a shape adjusting layer having a layer thickness which changes by heat;
a second step of arranging, on the shape adjusting layer, a reflection layer including a first layer, a second layer, and a barrier layer which is arranged between the first layer and the second layer, and prevents a diffusion of a material of the first layer and a material of the second layer; and
a third step of bringing a shape of the reflection layer close to a target shape by changing a layer thickness profile of the shape adjusting layer after the second step, the third step including a process of partially annealing the shape adjusting layer,
wherein the shape adjusting layer and the reflection layer each include corresponding adjustment positions, the adjustment positions being annealed portions of the shape adjusting layer and the reflection layer that are respectively thinner than non-annealed portions of the shape adjusting layer and the reflection layer after the process of the annealing.

2. The method according to claim 1, wherein in the third step, a measurement step of measuring the shape of the reflection layer, and an annealing step of partially annealing the shape adjusting layer based on the measurement result obtained in the measurement step, is repeated.

3. The method according to claim 1, wherein a temperature and a time used to partially anneal the shape adjusting layer in the third step are determined based on an amount by which the layer thickness of the shape adjusting layer is to be changed to bring the shape of the reflection layer close to the target shape.

4. The method according to claim 1, wherein both of the layer thickness of the shape adjusting layer and a layer thickness of the reflection layer change upon partially annealing the shape adjusting layer, and annealing is performed in the third step so that the shape of the reflection layer comes close to the target shape upon a change in layer thickness of the shape adjusting layer and a change in layer thickness of the reflection layer.

5. The method according to claim 1, wherein the process includes a process of applying heat to the shape adjusting layer by laser light irradiation.

6. The method according to claim 1, wherein the shape adjusting layer includes a multilayer film.

7. The method according to claim 1, wherein the shape adjusting layer includes a monolayer film.

8. A mirror comprising:
a substrate;
a shape adjusting layer arranged on the substrate; and
a reflection layer arranged on the shape adjusting layer,
wherein the shape adjusting layer is configured to change in layer thickness by heat,
the reflection layer includes a first layer, a second layer, and a barrier layer which is arranged between the first layer and the second layer, and prevents a diffusion of a material of the first layer and a material of the second layer, and the shape adjusting layer has a non-uniform layer thickness profile caused by partially annealing the shape adjusting layer, wherein the shape adjusting layer and the reflection layer each include corresponding adjustment positions, the adjustment positions being annealed portions of the shape adjusting layer and the reflection layer that are respectively thinner than non-annealed portions of the shape adjusting layer and the reflection layer after the annealing.

9. The mirror according to claim 8, wherein the shape adjusting layer includes a first material layer formed by a first material that is one material selected from the group consisting of Be, B, C, Si, P, S, K, Ca, Sc, Br, Rb, Sr, Y, Zr, Nb, Mo, Ba, La, Ce, Pr, Pa, and U, and a second material layer formed by a second material that is one material selected from the group and is different from the first material, and a layer thickness profile of the shape adjusting layer changes as the first material and the second material react with each other by heat partially applied to the shape adjusting layer.

10. An exposure apparatus which includes an optical system including a mirror, and is configured to expose a substrate to light via the optical system, the mirror comprising:
a substrate;
a shape adjusting layer arranged on the substrate; and
a reflection layer arranged on the shape adjusting layer,
wherein the shape adjusting layer is configured to change in layer thickness by heat,
the reflection layer includes a first layer, a second layer, and a barrier layer which is arranged between the first layer and the second layer, and prevents a diffusion of a material of the first layer and a material of the second layer, and the shape adjusting layer has a non-uniform layer thickness profile caused by partially annealing the shape adjusting layer, wherein the shape adjustinq layer and the reflection layer each include corresponding adjustment positions, the adjustment positions being annealed portions of the shape adjustinq layer and the reflection layer that are respectively thinner than non-annealed portions of the shape adjusting layer and the reflection layer after the annealing.

11. A device manufacturing method, comprising the steps of:
exposing a substrate to light by an exposure apparatus; and
developing the substrate,
wherein the exposure apparatus includes an optical system including a mirror, and is configured to expose a substrate to light via the optical system,
the mirror comprising:
a substrate;
a shape adjusting layer arranged on the substrate; and
a reflection layer arranged on the shape adjusting layer,
wherein the shape adjusting layer is configured to change in layer thickness by heat, the reflection layer includes a first layer, a second layer, and a barrier layer which is arranged between the first layer and the second layer, and prevents a diffusion of a material of the first layer and a material of the second layer, and the shape adjusting layer has a non-uniform layer thickness profile caused by partially annealing the shape adjusting layer, wherein the shape adjusting layer and the reflection layer each include corresponding adjustment positions, the adjustment positions being annealed portions of the shape adjusting layer and the reflection layer that are respectively thinner than non-annealed portions of the shape adjusting layer and the reflection layer after the annealing.

12. A mirror comprising:
a substrate;
a shape adjusting layer arranged on the substrate; and
a reflection layer arranged on the shape adjusting layer,
wherein the shape adjusting layer is configured to change in layer thickness by heat,
the reflection layer includes a first layer, a second layer, and a barrier layer which is arranged between the first layer and the second layer, and prevents a diffusion of a material of the first layer and a material of the second layer, and the shape adjusting layer has a non-uniform layer thickness profile caused by heating the shape adjusting layer, wherein the shape adjusting layer and the reflection layer each include corresponding adjustment positions, the adjustment positions being annealed portions of the shape adjusting layer and the reflection layer that are respectively thinner than non-annealed portions of the shape adjusting layer and the reflection layer after the heating.

13. An exposure apparatus which includes an optical system including a mirror, and is configured to expose a substrate to light via the optical system,
the mirror comprising:
a substrate;
a shape adjusting layer arranged on the substrate; and
a reflection layer arranged on the shape adjusting layer,
wherein the shape adjusting layer is configured to change in layer thickness by heat,
the reflection layer includes a first layer, a second layer, and a barrier layer which is arranged between the first layer and the second layer, and prevents a diffusion of a material of the first layer and a material of the second layer, and the shape adjusting layer has a non-uniform layer thickness profile caused by heating the shape adjusting layer, wherein the shape adjusting layer and the reflection layer each include corresponding adjustment positions, the adjustment positions being annealed portions of the shape adjusting layer and the reflection layer that are respectively thinner than non-annealed portions of the shape adjusting layer and the reflection layer after the heating.

* * * * *